(12) United States Patent
Nakanishi et al.

(10) Patent No.: US 9,590,654 B2
(45) Date of Patent: *Mar. 7, 2017

(54) SIGNAL MODULATION CIRCUIT

(71) Applicant: Onkyo Corporation, Osaka (JP)

(72) Inventors: Yoshinori Nakanishi, Osaka (JP);
Tsuyoshi Kawaguchi, Osaka (JP);
Mamoru Sekiya, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,329

(22) Filed: Jan. 12, 2015

(65) Prior Publication Data

US 2015/0207519 A1 Jul. 23, 2015

(30) Foreign Application Priority Data

Jan. 22, 2014 (JP) .................... 2014-9807

(51) Int. Cl.
*H03M 3/00* (2006.01)

(52) U.S. Cl.
CPC .......... *H03M 3/324* (2013.01); *H03M 3/348* (2013.01); *H03M 3/358* (2013.01); *H03M 3/42* (2013.01)

(58) Field of Classification Search
CPC .......... H03M 3/43; H03M 3/30; H03M 3/348; H03M 3/456; H03M 3/458; H03M 3/366; H03M 3/452
USPC .................................. 341/143, 155
See application file for complete search history.

(56) References Cited

U.S. PATENT DOCUMENTS

| | | | |
|---|---|---|---|
| 6,437,719 B1* | 8/2002 | Noro et al. ............... | 341/143 |
| 6,998,910 B2 | 2/2006 | Hezar et al. | |
| 8,106,809 B2 | 1/2012 | Groenewold | |
| 2002/0021238 A1* | 2/2002 | Noro et al. ............... | 341/143 |
| 2003/0058146 A1 | 3/2003 | Sundquist et al. | |

(Continued)

FOREIGN PATENT DOCUMENTS

| | | |
|---|---|---|
| JP | 2007-312258 | 11/2007 |
| JP | 4805177 | 11/2011 |
| JP | 2012-527187 | 11/2012 |

OTHER PUBLICATIONS

Extended European Search Report for corresponding European Application No. 15150016.2 dated Jun. 2, 2015.

(Continued)

*Primary Examiner* — Jean B Jeanglaude
(74) *Attorney, Agent, or Firm* — Renner, Otto, Boisselle & Sklar, LLP

(57) ABSTRACT

Provided is a circuit which can correct an output state in real time and reduce influences of distortion/noise components generated by a delay device. A signal modulation circuit includes a subtractor, an integrator, a phase inverting circuit, a DFF for while inserting a zero level at timing synchronous with the clock signal, delaying and quantizing the signal, a ternary signal generating circuit for generating a ternary signal for selectively driving a load connected to a single power supply into ternary conductive states including a positive current on-state, a negative current on-state, and an off-state, a driver circuit for generating a driving signal for driving a load, and a feedback circuit for feeding back the driving signal from the driver circuit to the input signal.

2 Claims, 5 Drawing Sheets

(56) References Cited

U.S. PATENT DOCUMENTS

2006/0044057 A1* 3/2006 Hezar .................. H03F 1/34
330/10
2008/0042745 A1* 2/2008 Kozak .................. H03F 1/02
330/251
2013/0057421 A1* 3/2013 Aruga et al. ............ 341/143

OTHER PUBLICATIONS

Office Action dated May 17, 2016 for corresponding European Application No. 15150016.2.

* cited by examiner

000
SIGNAL MODULATION CIRCUIT

BACKGROUND OF THE INVENTION

1. Field of the Invention

The present invention relates to a signal modulation circuit, and particularly relates to a circuit for performing delta sigma modulation.

2. Description of the Related Art

Conventionally, delta sigma modulation (ΔΣ modulation) is used in switching amplifiers or the like. A delta sigma modulator has a subtractor, an integrator, a quantizer, and a quantization error feedback circuit.

FIG. 4 illustrates a basic configuration of a delta sigma modulation circuit. A subtractor 16 calculates a difference between an input signal and a feedback signal, and an integrator 10 integrates the differential signal. An integrated signal is quantized by a quantizer 14 and is output as, for example, 1 bit (=binary) signal. The quantization error is fed back via a delay device 12.

JP 2007-312258 A discloses a delta sigma modulation circuit including an integrator group, an adder group, a quantizer, and a pulse width round-up circuit, and further discloses that a signal is converted into a one-bit signal synchronized with a sampling clock so as to be output. Further, this Patent Document discloses that a D-type flip-flop is used as a quantizer. JP 2012-527187 W also discloses a delta sigma modulation circuit.

Japanese Patent No. 4805177 describes a ternary one-bit digital amplifier that includes a switching unit for changing over a plurality of switches between on and off so as to provide a first state that a positive voltage is applied to a load, a second state that a voltage is not applied to the load, and a third state that a negative voltage is applied to the load.

In the configuration shown in FIG. 4, the delay device 12 is provided to a feedback path so that noise shaping is performed. At the same time, however, the configuration has a problem that the delay device 12 in the feedback path cannot correct an output state in real time, or a problem that noise shaping is not performed on distortion/noise components generated in the delay device and the distortion/noise components are directly output.

Further, when the delta sigma modulation circuit is used in a one-bit audio amplifier, pulse width modulation (PWM) and pulse density modulation (PDM) are used as a system for converting an input signal into a one-bit digital signal. When PDM that is suitable for a case where an input signal is expressed by pulse density and frequency is used, a zero level is inserted at predetermined timing so that a pulse width is maintained, and a level of the input signal is securely modulated into a frequency of the pulse.

In the Japanese Patent No. 4805177, a digital signal is generated by the delta sigma modulation and a ternary one-bit signal is generated, but an output signal from a switching circuit is fed back to the delta sigma modulation circuit, and a driver circuit is not taken into consideration.

It is an object of the present invention to provide a circuit for correcting an output state in real time, reducing influences of distortion/noise components generated by a delay device, and also reducing distortion of a driver circuit.

SUMMARY OF THE INVENTION

The present invention provides a signal modulation circuit for performing delta sigma modulation on an input signal in synchronization with a clock signal to output the modulated signal, the signal modulation circuit including: a subtractor for calculating a difference between the input signal and a feedback signal; an integrator for integrating an output from the subtractor; a quantizer for, while inserting a zero level into the signal integrated by the integrator at timing synchronous with the clock signal, delaying and quantizing the signal; a driver circuit for generating a driving signal for driving a load based on the signal from the quantizer; and a feedback circuit for feeding back the driving signal from the driver circuit to the input signal.

Further, the present invention provides a signal modulation circuit for performing delta sigma modulation on an input signal in synchronization with a clock signal to output the modulated signal, the signal modulation circuit including: a subtractor for calculating a difference between the input signal and a feedback signal; an integrator for integrating an output from the subtractor; a phase inverting circuit for inverting a phase of the signal integrated by the integrator; a first quantizer for, while inserting a zero level into the signal integrated by the integrator at timing synchronous with the clock signal, delaying and quantizing the signal; a second quantizer for while inserting a zero level into the signal whose phase is inverted by the phase inverting circuit at the timing synchronous with the clock signal, delaying and quantizing the signal; a ternary signal generating circuit for generating a ternary signal for selectively driving a load connected to a single power supply into ternary conductive states including a positive current on-state, a negative current on-state, and an off-state using the signal from the first quantizer and the signal from the second quantizer; a driver circuit for generating a driving signal for driving the load based on the signal from the ternary signal generating circuit; and a feedback circuit for feeding back the driving signal from the driver circuit to the input signal.

In the present invention, while the zero level is being inserted at the timing synchronous with a clock signal, a signal is quantized by the quantizer so that a pulse density modulation signal whose pulse width is fixed is generated, and the load is driven by the driver circuit using this modulation signal. Not the modulation signal but the driving signal output from the driver circuit to the load is fed back to the input signal so that a distortion component included in the driver circuit is suppressed. Also when a ternary signal is generated from a pulse density modulation signal and the load is driven into three states (a positive current or positive voltage on state, a negative current or negative voltage on state, and an off state), a driving signal of the driver circuit is fed back to an input signal, so that the distortion component of the driver circuit is suppressed.

According to the present invention, an output state can be corrected in real time, and influences of distortion/noise components in the delay device can be reduced, and the distortion of the driver circuit can be also reduced. Particularly the distortion of the driver circuit in a ternary pulse density modulation circuit can be suppressed.

DETAILED DESCRIPTION OF THE PREFERRED EMBODIMENTS

Embodiments of the present invention will be described below with reference to the drawings.

<Circuit Configuration of the Premise>

Figure 1:
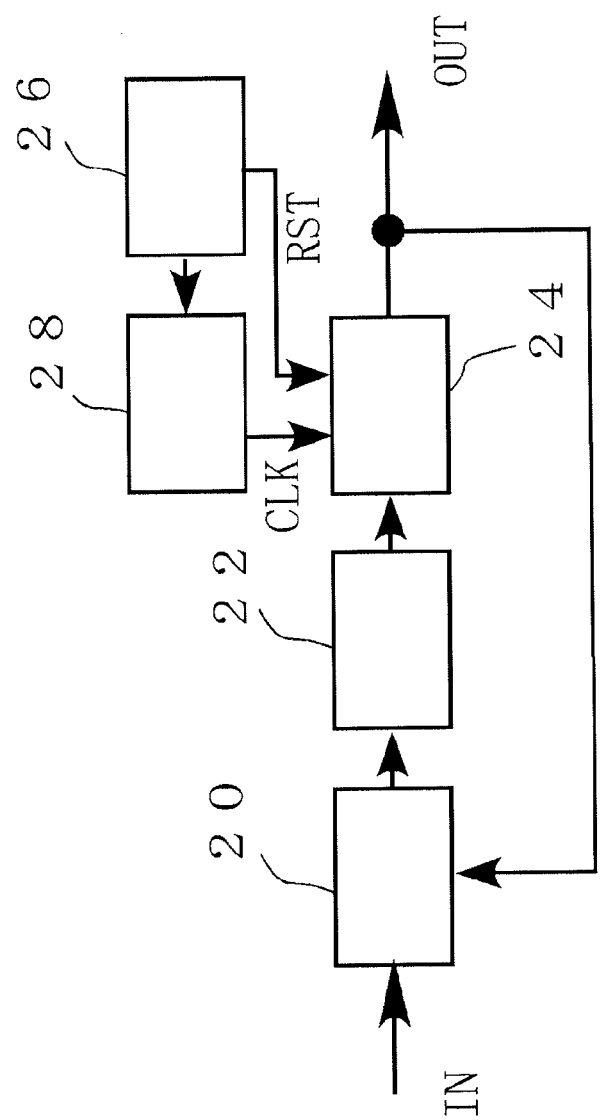
FIG. 1 a circuit configuration diagram that is the premise of an embodiment.

A circuit configuration that is the premise of an embodiment is described below. FIG. 1 illustrates the circuit configuration that is the premise. A signal modulation circuit in FIG. 1 is for performing delta sigma modulation on an input signal, and includes a subtractor 20, an integrator 22, a DFF (delay type flip-flop) 24 as a quantizer. A clock signal from a clock signal source 26 is delayed by a delay circuit 28 and is supplied to a clock terminal of the DFF 24, and the clock signal is supplied also to a reset terminal of the DFF 24.

The subtractor 20 calculates a difference between the input signal and a feedback signal so as to output the difference to the integrator 22. The integrator 22 integrates a differential signal so as to output it to the DFF 24. The DFF 24 converts an output from the integrator 22 into a 1-bit digital signal in synchronization with a clock signal so as to output it, and a feedback circuit feeds back the output signal to the subtractor 20.

Figure 4:
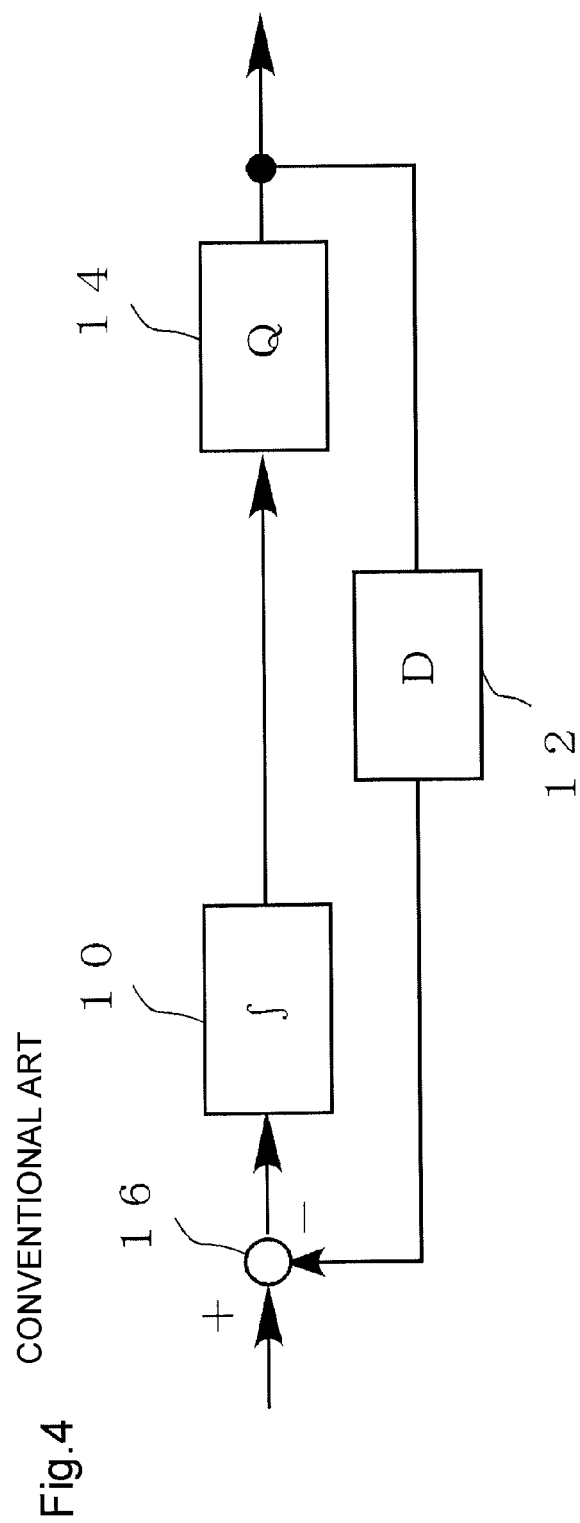
FIG. 4 a conventional circuit configuration diagram.

When the circuit shown in FIG. 1 is compared with the circuit shown in FIG. 4, a delay device 12 is not present in the feedback circuit in the circuit shown in FIG. 1, and the DFF 24 is provided to a subsequent stage of the integrator 22. In the circuit in FIG. 1, therefore, an output state can be corrected in real time. Further, a delay function and a quantizing function are realized by the DFF 24, but a signal is supplied to a reset terminal in the DFF 24 so that an output from the DFF 24 is made to be zero, and a clock signal is supplied to the reset terminal so that a zero level is inserted at timing synchronous with the clock signal.

In the circuit configuration shown in FIG. 1, since the zero level always is inserted at the timing synchronous with the clock signal, the output from the DFF 24 is a 1-bit digital signal, and its pulse width is always fixed. That is to say, since a signal is output at a rising edge of the input clock signal in the DFF, when the delay circuit 28 delays and inverts the clock signal so as to supply it, the signal is output at a falling edge of the clock signal, but the output is reset to the zero level at a next rising edge of the clock signal. Thereafter, this processing is repeated so that the pulse width of the 1-bit digital signal is equal to the pulse width of the clock signal. In the circuit configuration of FIG. 1, the pulse width can express a magnitude of the input signal using a number of fixed pulses.

<Circuit Configuration in the Embodiment>

Figure 2:
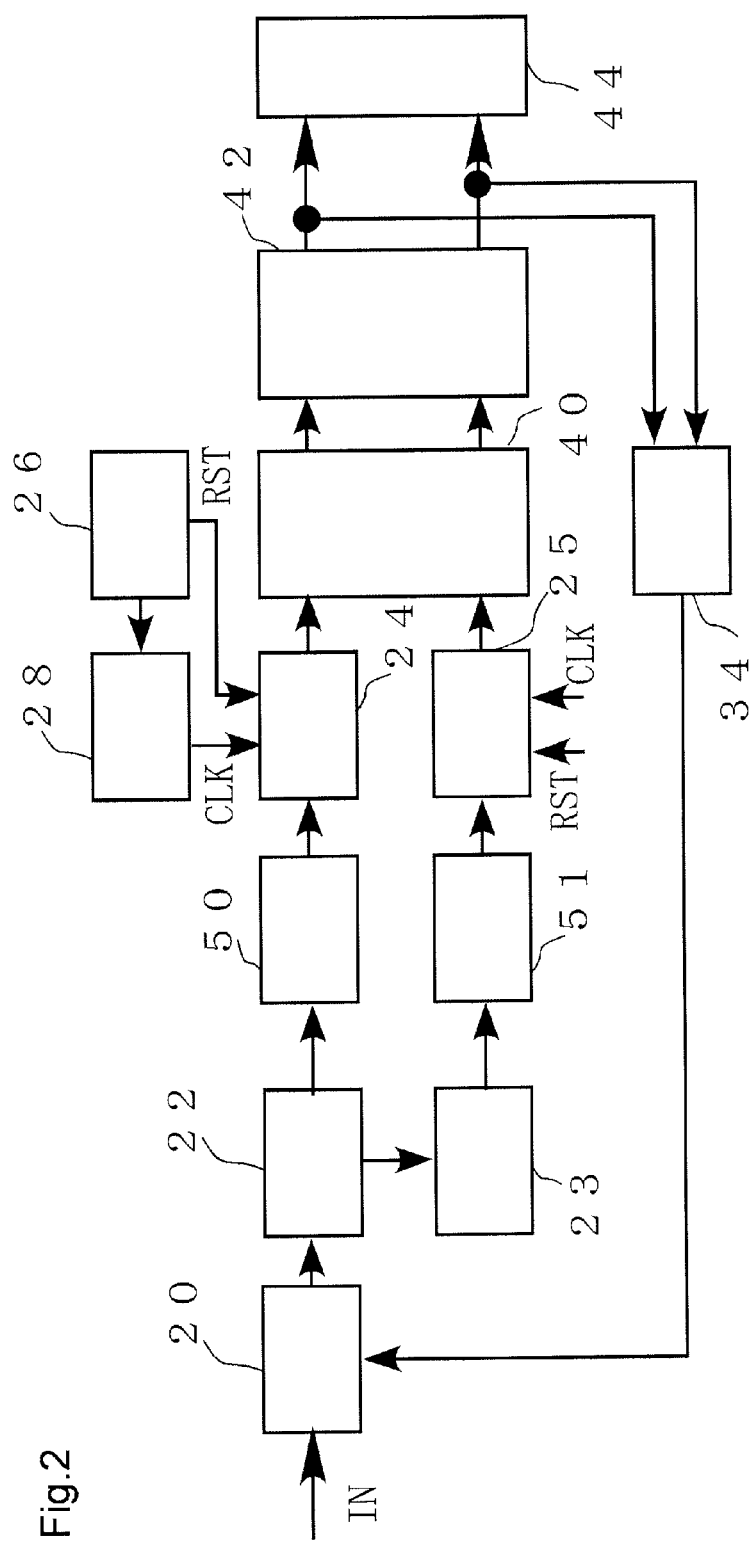
FIG. 2 is a circuit configuration diagram according to the embodiment.

FIG. 2 illustrates the signal modulation circuit according to the embodiment using the circuit configuration in FIG. 1 as a base. The signal modulation circuit includes the subtractor 20, the integrator 22, a phase inverting circuit 23, bias generating circuits 50 and 51, the DFF 24, a DFF 25, the clock signal source 26, the delay circuit 28, a single-valued ternary waveform generating circuit 40, a driver circuit 42, and a pulse synthesizing circuit 34.

The subtractor 20 calculates the difference between the input signal and the feedback signal so as to output the difference to the integrator 22, similarly to FIG. 1.

The integrator 22 integrates a difference signal so as to output the integrated signal to the bias generating circuit 50 and the phase inverting circuit 23.

The phase inverting circuit 23 inverts a phase of an output from the integrator 22 so as to output it to the bias generating circuit 51.

The bias generating circuits 50 and 51 apply predetermined biases to the output from the integrator 22 and the output from the phase inverting circuit 23, respectively, so as to output them to the DFFs 24 and 25, respectively. The bias generating circuits 50 and 51 adjust output operating points of the integrators 22 and 23, but this is done in order to realize a non-switching state as a secure zero level (zero voltage) in a non-signal state.

The DFFs 24 and 25 convert the outputs from the bias generating circuits 50 and 51 into 1-bit digital signals so as to output them. At this time, while inserting a zero level at timing when the clock signal is supplied to the reset terminals, the DFFs 24 and 25 convert them into 1-bit digital signals.

The single-valued ternary waveform generating circuit 40 generates a single-valued ternary waveform signal from the output from the DFF 24, namely, a binary signal of +1 or 0, and the output from the DFF 25, namely, a binary signal of −1 or 0. Here, "single-valued ternary" means to realize three driving states including a state of driving with a positive current, a state of driving with a negative current, and an off state for a load such as a speaker to be driven by the single power supply. The positive current and the negative current mean that directions of electric currents flowing in the load are opposite to each other.

The driver circuit 42 drives the load 44 such as a speaker using the single-valued ternary waveform signal from the single-valued ternary waveform generating circuit 40. The driving signal from the driver circuit 42 is supplied to the load 44 such as a speaker, and supplied also to the pulse synthesizing circuit 34.

The pulse synthesizing circuit 34 synthesizes the driving signal from the driver circuit 42 so as to generate a feedback signal and feed back this signal to the subtractor 20.

A characteristic in FIG. 2 is that the driver circuit 42 is included in the feedback circuit. That is to say, the driving signal from the driver circuit 42 is supplied to the load 44, and further fed back as the feedback signal to the subtractor 20 via the pulse synthesizing circuit 34. Therefore, when the driver circuit 42 is provided outside the feedback circuit, a distortion of the driver circuit 42 is supplied as the driving signal directly to the load 44, but in this embodiment, the distortion of the driver circuit 42 is also fed back to be reduced.

Figure 3:
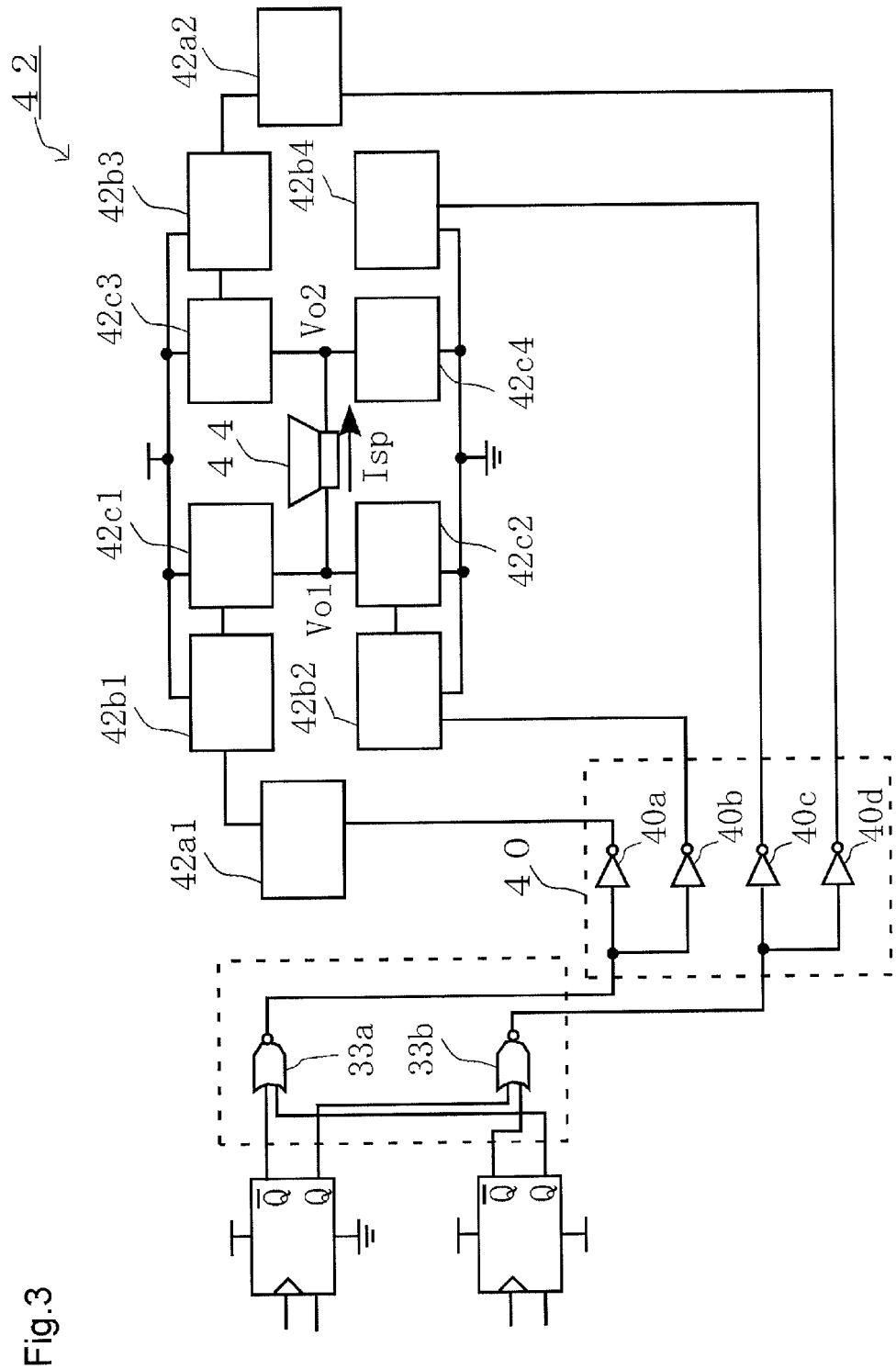
FIG. 3 is a circuit configuration diagram of a single-valued ternary waveform generating circuit and a driver circuit.

FIG. 3 illustrates circuit configurations of the single-valued ternary waveform generating circuit 40 and the driver circuit 42. The single-valued ternary waveform generating circuit 40 is composed of NOR gates 33a and 33b, and four NOT gates 40a to 40d. The NOT gates 40a to 40d are referred to as G11, G12, G13, and G14, respectively, from the top of the figure. That is, the NOT gate 40a is G11, the NOT gate 40b is G12, the NOT gate 40c is G13, and the NOT gate 40d is G14. An output signal from the NOR gate 33a is supplied to the gates G11 and G12, and an output signal from the NOR gate 33b is supplied to the gates G13 and G14. The gates G11 to G14 invert an input signal, and supply output signals to the driver circuit 42.

The NOR gate 33a performs a logical operation on a signal from an inverting output terminal (Q bar) of a DFF32 and a signal from an output terminal (Q) of a DFF33, and outputs the signal. The NOR gate 33b performs the logical operation on a signal from the output terminal (Q) of the DFF32 and a signal from an inverting output terminal (Q bar) of the DFF33, and output the signal.

The driver circuit 42 includes level shift circuits 42a1 and 42a2, gate driving circuits 42b1 to 42b4, and switching FETs 42c1 to 42c4. The switching FETs 42c1 and 42c3 are P-channel FETs, and the switching FETs 42c2 and 42c4 are N-channel FETs.

One end of the speaker as the load 44 is connected to a connection node between the switching FET 42c1 and the switching FET 42c2 connected to each other in series, and the other end is connected to a connection node between the switching FET 42c3 and the switching FET 42c4 connected to each other in series. The switching FET 42c1 and the switching FET 42c3 are connected to a positive pole side of the single power supply, and the switching FET 42c2 and the switching FET 42c4 are connected to a negative pole side of the single power supply. Therefore, when the switching FET 42c1 is turned on, the switching FET 42c2 is turned off, the switching FET 42c3 is turned off, and the switching FET 42c4 is turned on, an electric current flows in the order of the switching FET 42c1, the speaker 44, and the switching FET 42c4, so that a positive current on-state is obtained. Further, when the switching FET 42c1 is turned off and the switching FET 42c2 is turned on, and when the switching FET 42c3 is turned on and the switching FET 42c4 is turned off, an electric current flows in the order of the switching FET 42c3, the speaker 44, and the switching FET 42c2, so that a negative current on-state is obtained. Further, when the switching FETs 42c1 and 42c3 are turned off, and the switching FETs 42c2 and 42c4 are turned on, an electric current does not flow in the speaker 44 so that the off-state (off state caused by short-circuit) is obtained.

Output signals from the four logic gates G11 to G14 of the single-valued ternary waveform generating circuit 40 are supplied to the gate driving circuits 42b1 to 42b4 in order to drive the four switching FETs 42c1 to 42c4, respectively. That is, the output signal from the gate G11 is supplied to the gate driving circuit 42b1 via the level shift circuit 42a1, so as to drive the switching FET 42c1. The output signal from the gate G12 is supplied to the gate driving circuit 42b2 so as to drive the switching FET 42c2. The output signal from the gate G14 is supplied to the gate driving circuit 42b3 via the level shift circuit 42a2 so as to drive the switching FET 42c3. The output signal from the gate G13 is supplied to the gate driving circuit 42b4 so as to drive the switching FET 42c4.

When the outputs from the NOR gates 33a and 33b are "1" and "0", respectively, the outputs from the gates G11 and G12 are "0" obtained by inverting "1", and the outputs from the gates G13 and G14 are "1" obtained by inverting "0". As a result, the switching FET 42c1 is turned on, the switching FET 42c2 is turned off, the switching FET 42c3 is turned off, and the switching FETc4 is turned on, so that an electric current flows in the order of the switching FET 42c1, the speaker 44, and the switching FET 42c4 (+ON state).

When the outputs from the NOR gates 33a and 33b are "0" and "1", respectively, the outputs from the gates G11 and G12 are "1" obtained by inverting "0", and the outputs from the gates G13 and G14 are "0" obtained by inverting "1". As a result, the switching FET 42c1 is turned off, the switching FET 42c2 is turned on, the switching FET 42c3 is turned on, and the switching FET 42c4 is turned off, so that an electric current flows in the order of the switching FET 42c3, the speaker 44, the switching FET 42c2 (−ON state).

When the outputs from the NOR gates 33b and 33a are "1", the outputs from the gates G11 to G14 are "0" obtained by inverting "1". As a result, the switching FET 42c1 is turned on, the switching FET 42c2 is turned off, the switching FET 42c3 is turned on, and the switching FET 42c4 is turned off, so that an electric current does not flow in the speaker 44 (OFF state).

Further, when the outputs from the NOR gates 33b and 33a are "0", the outputs from the gates G11 to G14 are "1" obtained by inverting "0". As a result, the switching FET 42c1 is turned off, the switching FET 42c2 is turned on, the switching FET 42c3 is turned off, and the switching FET42c4 is turned on, so that an electric current does not flow in the speaker 44 (OFF state).

As described above, the single-valued ternary waveform generating circuit 40 generates a signal for driving a single power supply three-state speaker based on the ternary pulse density modulation signal, so that the load 44 can be driven without enlarging a scale of the circuit.

Figure 5:
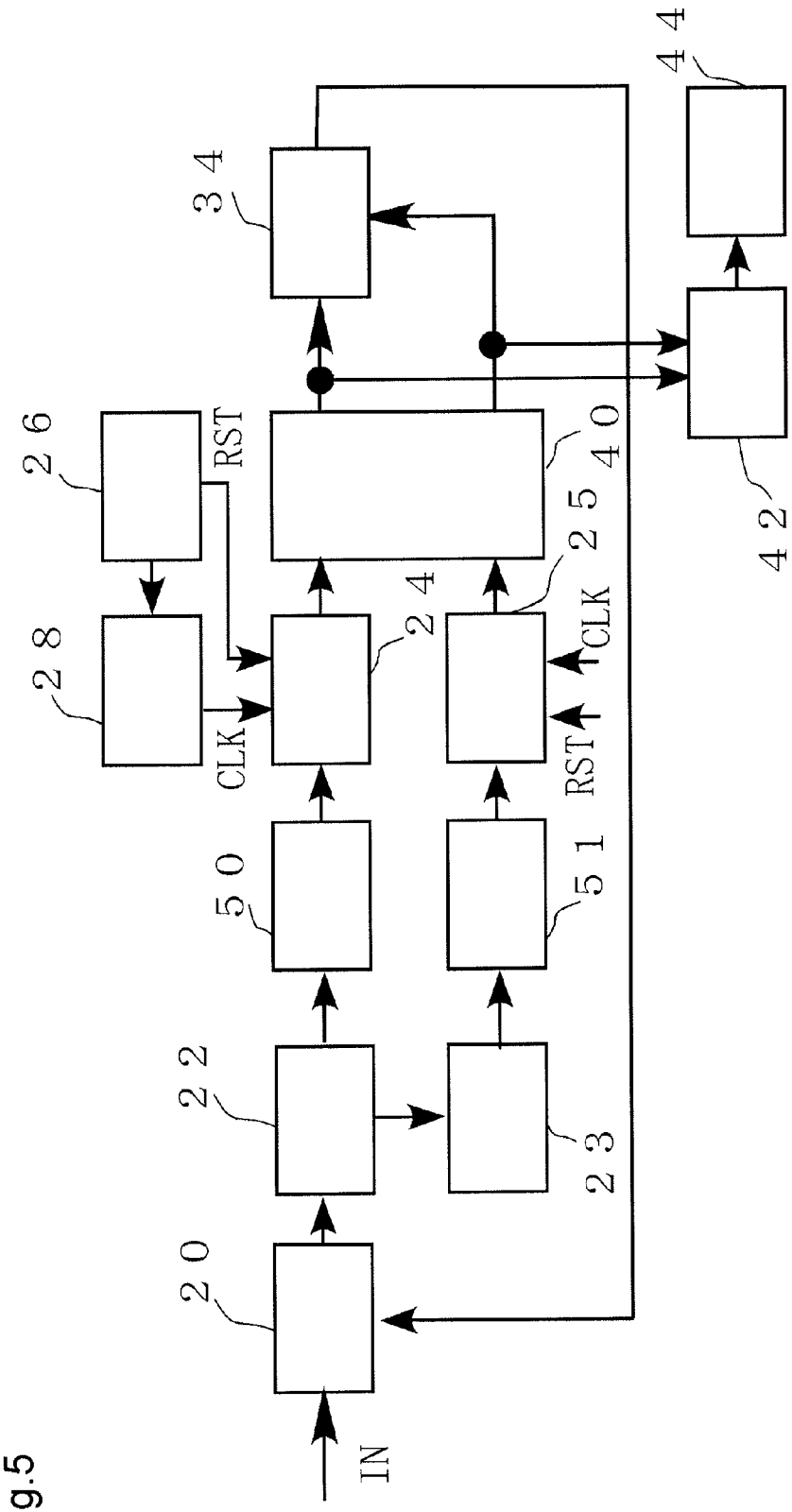
FIG. 5 is a comparative circuit configuration diagram.

The pulse synthesizing circuit 34 synthesizes a driving signal of the driver circuit 42 so as to generate a feedback signal. For example, in the circuit configuration of FIG. 3, however, a plurality of resistors are connected to the switching FET 42c2 in parallel, and a voltage divided signal is output. Further, a plurality of resistors are connected to the switching FET 42c4 in parallel, and a voltage divided signal is output. The pulse synthesizing circuit 34 synthesizes both the voltage divided signals so as to generate a feedback signal. When the constitution in this embodiment is compared with the constitution of FIG. 5 where the driving signal of the driver circuit 42 is not fed back, a distortion of the driver circuit 42 is greatly improved in this embodiment.

According to this embodiment, the output state can be corrected in real time and influences of the distortion/noise components due to the delay device can be reduced. Further, a zero level is inserted at predetermined timing so that a pulse width can be maintained, and the distortion of the driver circuit 42 can be also reduced.

The above has described the embodiment of the present invention, but the present invention is not limited to this, and thus various modifications can be made.

For example, in the circuit configuration of FIG. 2, the bias generating circuits 50 and 51 are provided, but the bias generating circuits 50 and 51 do not have to be necessarily provided.

Further, in this embodiment, the DFFs 24 and 25 are provided as the quantizers, but instead of them, the quantizers may be composed of a chopper circuit and a DFF. When an on/off state of the switching of the chopper circuit is controlled by a clock signal, a one-bit digital signal can be generated during the insertion of a zero level at the timing synchronous with the clock signal.

What is claimed is:
1. A signal modulation circuit for performing delta sigma modulation on an input signal in synchronization with a clock signal to output the modulated signal, the circuit comprising:
   a subtractor for calculating a difference between the input signal and a feedback signal;
   an integrator for integrating an output from the subtractor;
   a quantizer for, while inserting a zero level into the signal integrated by the integrator at timing synchronous with the clock signal in order to maintain a pulse width, delaying the signal and quantizing the signal;
   a driver circuit for generating a driving signal for driving a load based on the signal from the quantizer; and
   a feedback circuit for feeding back the driving signal from the driver circuit to the input signal.

2. A signal modulation circuit for performing delta sigma modulation on an input signal in synchronization with a clock signal to output the modulated signal, the circuit comprising:
- a subtractor for calculating a difference between the input signal and a feedback signal;
- an integrator for integrating an output from the subtractor;
- a phase inverting circuit for inverting a phase of the signal integrated by the integrator;
- a first quantizer for, while inserting a zero level into the signal integrated by the integrator at timing synchronous with the clock signal in order to maintain a pulse width, delaying and quantizing the signal;
- a second quantizer for, while inserting a zero level into the signal whose phase is inverted by the phase inverting circuit at the timing synchronous with the clock signal in order to maintain a pulse width, delaying and quantizing the signal;
- a ternary signal generating circuit for generating a ternary signal for selectively driving a load connected to a single power supply into ternary conductive states including a positive current on-state, a negative current on-state, and an off-state using the signal from the first quantizer and the signal from the second quantizer;
- a driver circuit for generating a driving signal for driving the load based on the signal from the ternary signal generating circuit; and
- a feedback circuit for feeding back the driving signal from the driver circuit to the input signal.

* * * * *